(12) United States Patent
Lim et al.

(10) Patent No.: US 9,768,093 B1
(45) Date of Patent: Sep. 19, 2017

(54) RESISTIVE STRUCTURE WITH ENHANCED THERMAL DISSIPATION

(71) Applicant: Altera Corporation, San Jose, CA (US)

(72) Inventors: Queennie Suan Imm Lim, San Jose, CA (US); Shahla Honarkhah, San Jose, CA (US)

(73) Assignee: Altera Corporation, San Jose, CA (US)

( * ) Notice: Subject to any disclaimer, the term of this patent is extended or adjusted under 35 U.S.C. 154(b) by 13 days.

(21) Appl. No.: 15/061,483

(22) Filed: Mar. 4, 2016

(51) Int. Cl.
*H01L 23/36* (2006.01)
*H01L 23/367* (2006.01)
*H01L 27/08* (2006.01)
*H01L 23/522* (2006.01)
*H01L 21/768* (2006.01)
*H01L 49/02* (2006.01)

(52) U.S. Cl.
CPC ...... *H01L 23/367* (2013.01); *H01L 21/76895* (2013.01); *H01L 23/5226* (2013.01); *H01L 27/0802* (2013.01); *H01L 28/20* (2013.01)

(58) Field of Classification Search
CPC .......................... H01L 23/367; H01L 21/768
See application file for complete search history.

(56) References Cited

U.S. PATENT DOCUMENTS

| 4,492,947 | A | 1/1985 | Staats et al. | |
|---|---|---|---|---|
| 6,232,231 | B1* | 5/2001 | Sethuraman | H01L 21/3212 257/E21.304 |
| 6,314,216 | B1 | 11/2001 | Schulte et al. | |
| 6,549,690 | B2 | 4/2003 | Schulte et al. | |
| 6,940,720 | B2 | 9/2005 | Fischer et al. | |
| 8,848,374 | B2* | 9/2014 | Lin | H01L 23/3677 361/676 |
| 2008/0102584 | A1* | 5/2008 | Kerr | H01L 23/3677 438/275 |
| 2016/0254345 | A1* | 9/2016 | Singh | H01L 23/5223 |

* cited by examiner

*Primary Examiner* — Calvin Choi
*Assistant Examiner* — S. M. S Imitiaz

(57) ABSTRACT

An integrated circuit is provided. The integrated circuit includes a continuous resistor body having first and second distal terminals, and a group of electrically-floating dummy conductors that are formed above the continuous resistor body, and between the first and second distal terminals of the continuous resistor body. Each of the group of dummy conductors is coupled to the continuous resistor body through a respective via structure. The group of dummy conductors serves to dissipate heat for the continuous resistor body. If desired, an active conductor is interposed in the dummy conductors and serves as a center-tap for the continuous resistor body. The active conductor is connected to a contact node on the substrate.

12 Claims, 9 Drawing Sheets

RESISTIVE STRUCTURE WITH ENHANCED THERMAL DISSIPATION

BACKGROUND

As the semiconductor industry continues to grow, the need to develop increasingly complex integrated circuit devices with smaller feature sizes and dimensions has been highly sought after. Driven by the demand for high performance, such integrated circuit devices are developed to higher integration. In accordance with high integration of integrated circuit devices, more leads and circuits are required, which increases noise.

Generally, passive electrical components such as resistors have been incorporated in an integrated circuit device to eliminate noise and achieve the requirements for electrical characteristics of the integrated circuit device. For example, resistors have been used in many integrated circuit structures (e.g., resistor-capacitor (RC) oscillators, current limitation resistance, electrostatic discharge (ESD) protect, RF back-end drive (RF post drivers), on-chip termination, impedance matching, etc.) to provide effective resistance function at lower cost. However, resistors often exhibit high sheet resistance, and joule heating of these resistors can negatively impact circuit performance and increase the chances of metal electromigration wear-out in the integrated circuit device. This may lead to eventual failure of electrical components in the integrated circuit device.

SUMMARY

In accordance with the present invention, methods and apparatus for a resistor structure having enhanced thermal dissipation are provided.

It is appreciated that the present invention can be implemented in numerous ways, such as a process, an apparatus, a system, or a device. Several inventive embodiments of the present invention are described below.

An integrated circuit is provided that includes a continuous resistor body having first and second distal terminals, and a group of dummy conductors that are formed above the continuous resistor body and between the first and second distal terminals of the continuous resistor body. Each of the group of dummy conductors may be coupled to the continuous resistor body through a respective via structure. The dummy conductors in the group are parallel to each other and may run perpendicular to the continuous resistor body.

In another suitable variation, the integrated circuit includes a substrate, a resistor body formed on the substrate, and an electrically floating dummy conductor above the resistor body. The dummy conductor is connected to the resistor body and that serves only to dissipate heat for the resistor body. The dummy conductor includes one of parallel, electrically floating, dummy conductors that are not actively driven. The integrated circuit further includes a via that is coupled between the dummy conductor and the resistor body to facilitate heat dissipation for the resistor body.

A method of forming a resistor on an integrated circuit is provided. The method includes forming a resistor body having first and second terminals on a substrate, a dummy conductor structure between the first and second terminals of the resistor body, and a via structure having a first end that is connected to the dummy conductor structure and a second end that is connected to the resistor body. The dummy conductor structure may be in the form of parallel strips, a plate, or an array.

The method further includes forming a first terminal conductive element that is coupled to the first terminal of the resistor body, and a second terminal conductive element that is coupled to the second terminal of the resistor body. If desired, a center tap can be formed in the resistor by forming an active conductor that is interposed directly between first and second dummy conductors of dummy conductor structure and is connected to the resistor body.

Further features of the invention, its nature and various advantages, will be more apparent from the accompanying drawings and the following detailed description of the preferred embodiments.

DETAILED DESCRIPTION

The embodiments provided herein include methods and apparatus for a resistor structure having enhanced thermal dissipation.

It will be obvious, however, to one skilled in the art, that the present exemplary embodiments may be practiced without some or all of these specific details described with reference to the respective embodiments. In other instances, well-known operations have not been described in detail in order not to unnecessarily obscure the present embodiments.

Figure 1:
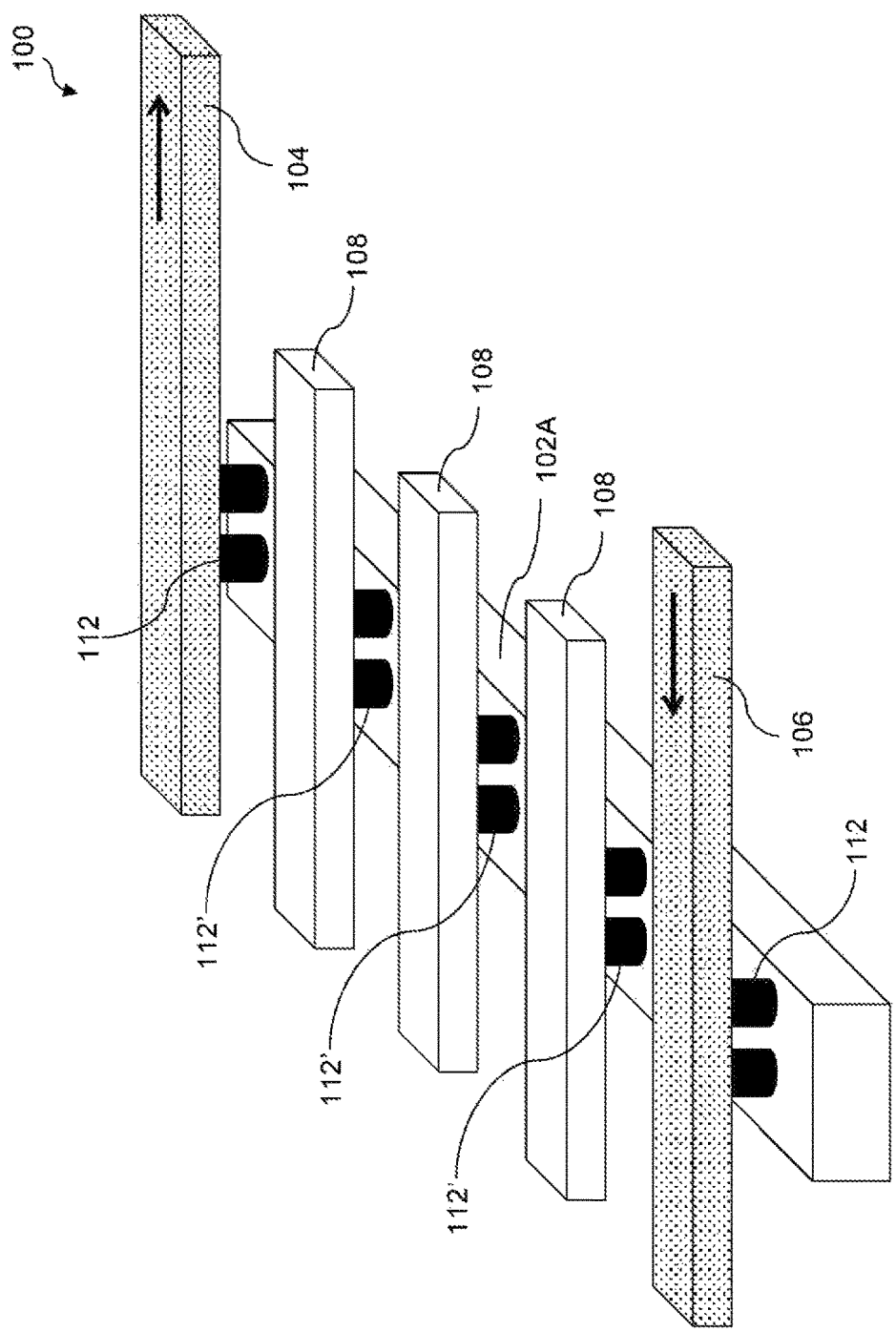
FIG. 1 is a perspective view of an illustrative resistor structure in accordance with an embodiment of the present invention.

FIG. 1 is a perspective view of an illustrative resistor structure 100 in accordance with an embodiment of the present invention. Resistor structure 100 may be provided as part of an integrated circuit device, which is not shown here so as not to obscure the present invention. In FIG. 1, resistor structure 100 includes continuous resistor body 102 (or resistor body 102). For example, resistor body 102 may be formed from polysilicon, nitride, titanium, platinum, or other suitable resistive material.

Resistor body 102 may include two distal terminals, with each terminal coupled to a conductive strip (e.g., metal strips 104 and 106) through conductive via structures (e.g., via structures 112). In FIG. 1, the location at which conductive strips 104 and 106 connect to resistor body 102 may represent the location of the respective distal terminals of resistor body 102. As an example, conductive strip 104 may be connected to a power source, whereas the conductive strip 106 may be connected to a ground source (or vice versa).

During normal operation of the integrated circuit, the resistance of resistor body 102 tends to increase with increasing temperature. The heat generated at the center of resistor body 102 has a lower degree of heat dissipation than the edges of resistor body 102 due to less surface area. Hence, a heat dissipation structure that includes a group of dummy conductors 108 may be formed above resistor body 102 and between conductive strips 104 and 106.

As shown in FIG. 1, each dummy conductor 108 is connected to resistor body 102 through a respective via structure 112'. In one embodiment, dummy conductors 100 and via structures 112' may collectively act as a heat sink in the center of resistor body 102 to improve reliability of high-resistance resistors, such as resistor structure 100. Heat may dissipate upwards through via structures 112', which may subsequently result in an enhanced electromigration lifetime and a lesser amount of heat confined in resistor body 102. As an example, dummy conductors 108 may include parallel metal strips that are not electrically connected to each other, but may act as "dummy" elements or electrically floating (i.e., not actively driven) elements whose primary purpose is to dissipate heat for resistor body 102. In one embodiment, dummy conductors 108 may run perpendicular to resistor body 102.

Figure 2:
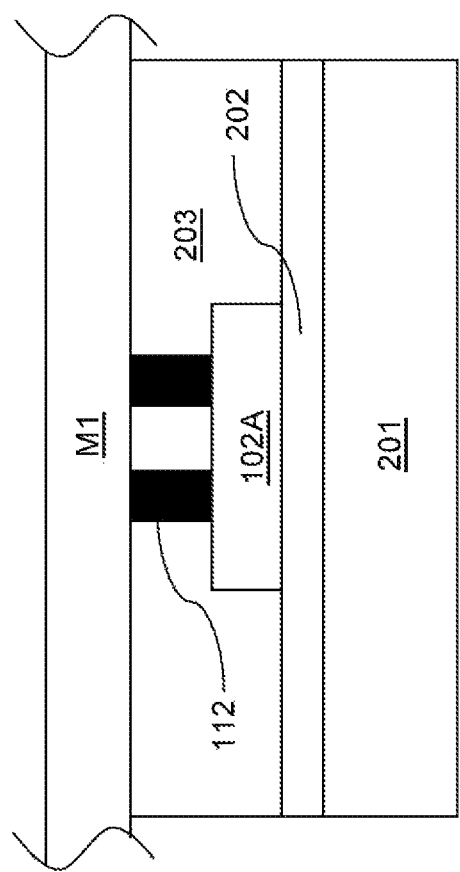
FIG. 2 is a cross-sectional side view of an illustrative resistor structure in accordance with an embodiment of the present invention.

FIG. 2 is a cross-sectional view of resistor structure 100 of FIG. 1 that is formed on semiconductor substrate 203 in accordance with an embodiment of the present invention. Resistor structure 100 may include resistor body 102, which is formed over a surface of semiconductor substrate 203 via insulating layer 202 (e.g., a silicon oxide layer 202). Another insulating layer 204 is formed so as to cover both resistor body 102 and insulation layer 202. Metal layer M1 is formed on insulation layer 204. Metal layer M1 may connect resistor body 102 to other electrical devices (not shown) through via structures 112 and/or via structures 112' of FIG. 1. In one embodiment, metal layer M1 may include conductive strips 104 and 106 of FIG. 1. Metal layer M1 may also include dummy conductors 108 of FIG. 1.

FIGS. 3, 4, 5, and 6 each show a top view of resistor structure 301 having different configurations of dummy conductor structures on semiconductor substrate 303 in accordance with an embodiment of the present invention. It should be appreciated that components shown in resistor structure 101 of FIGS. 1 and 2 could be employed as part of resistor structure 301 of FIGS. 3, 4, 5, and 6 to provide functionality similar to that described above.

As an example, as shown in FIGS. 3, 4, 5, and 6, resistor structure 301 includes continuous resistor body 102 (or resistor body 102). An additional resistor body (e.g., resistor body 302) may be connected to resistor body 102 in series. Each of resistor bodies 102 and 302 has two distal terminals, with each distal terminal coupled to a conductive metal strip (e.g., conductive strips 104 and 106) through via structures 112. Conductive strips 104 and 106 may represent the respective distal terminals of resistor bodies 102 and 302. For example, conductive strip 104 may be connected to a power source, and the conductive strip 106 may be connected to a ground source.

In one embodiment, resistor bodies 102 and 302 have positive temperature coefficients (PTCs). With a positive temperature coefficient, the resistance would increase with an increase in temperature. During operation, resistor bodies 102 and 302 and their surroundings may heat up. In order to dissipate the thermal energy or heat produced by resistor bodies 102 and 302, a dummy conductor structure may be formed above resistor bodies 102 and 302 and between conductive strips 104 and 106. The dummy conductor structure may be in the form of strips, a plate, an array of plate segments, or any suitable form. The dummy conductor structure may also include via structures 112' that facilitates the transfer of thermal energy or heat from resistor bodies 102 and 302 to dummy conductors 108.

Figure 3:
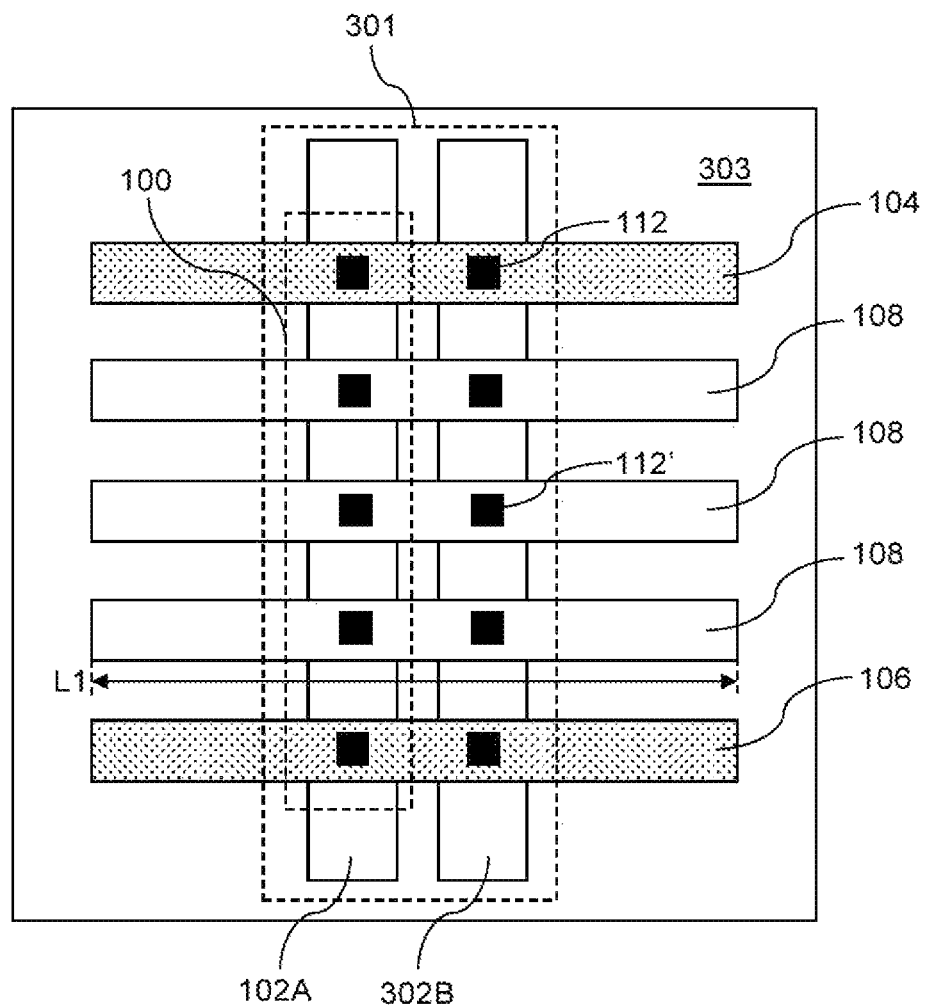
FIG. 3 is a top view of a resistor structure having a parallel dummy conductor structure on a substrate in accordance with an embodiment of the present invention.
Figure 4:
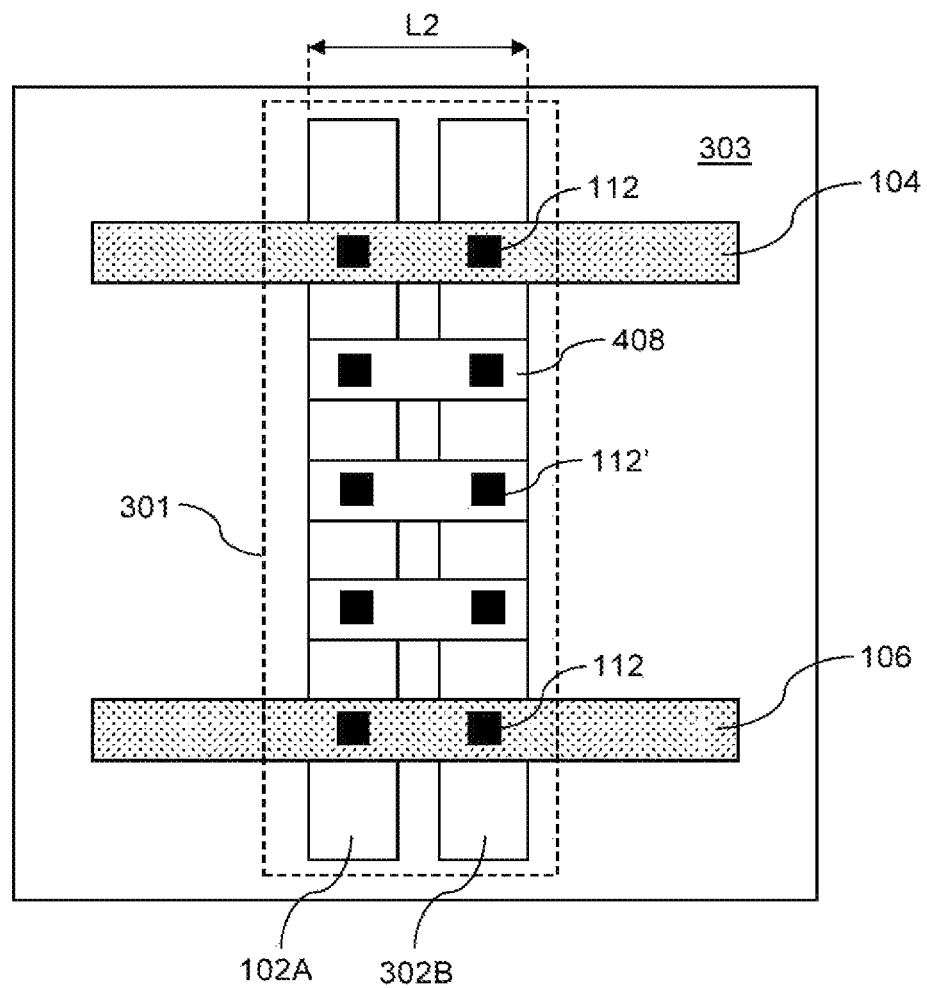
FIG. 4 is a top view of another resistor structure having a parallel dummy conductor structure on a substrate in accordance with an embodiment of the present invention.
Figure 5:
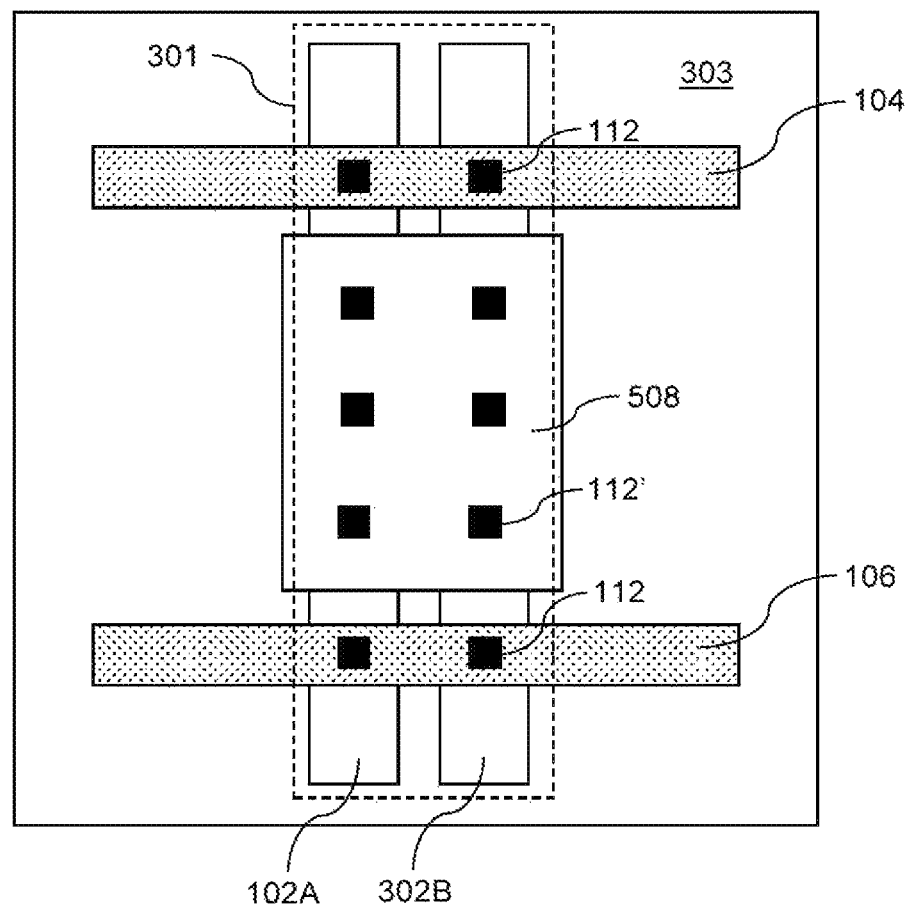
FIG. 5 is a top view of a resistor structure having a dummy conductive plate structure on a substrate in accordance with an embodiment of the present invention.
Figure 6:
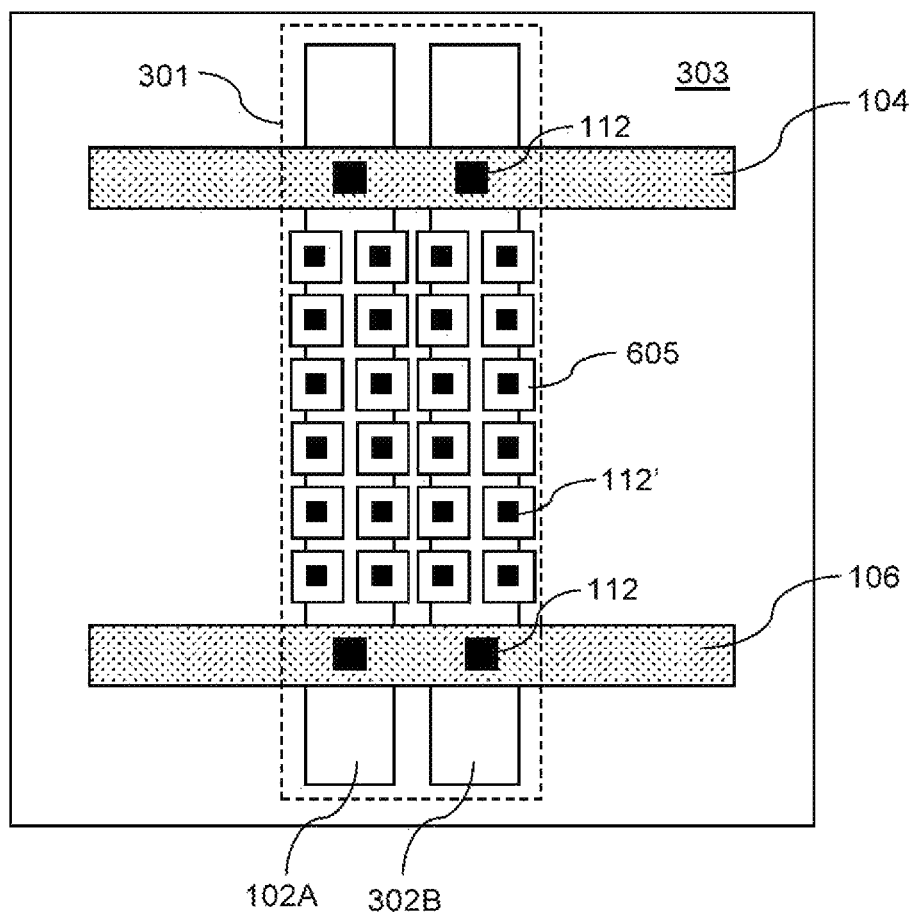
FIG. 6 is a top view of a resistor structure having a group of dummy conductor elements arranged in an array on a substrate in accordance with an embodiment of the present invention.

For example, as shown in FIGS. 3 and 4, a group of parallel dummy conductors (e.g., dummy conductors 108 and 408) may be formed above resistor bodies 102 and 302 and between conductive strips 104 and 106. In one embodiment, each of dummy conductors 108 has a length (e.g., L1) that exceeds the width of the resistor bodies 102 and 302 (as shown in FIG. 3). Alternatively, in another embodiment, each of dummy conductors 408 has a length (e.g., L2) that is equal to the width of the resistor bodies 102 and 302 (as shown in FIG. 4). In another example, as shown in FIG. 5, a dummy conductive plate 508 may be formed above resistor bodies 102 and 302 and between conductive strips 104 and 106. In yet another example, as shown in FIG. 6, an array of dummy conductor elements 605 may be arranged above resistor bodies 102 and 302 and between conductive strips 104 and 106.

Figure 7:
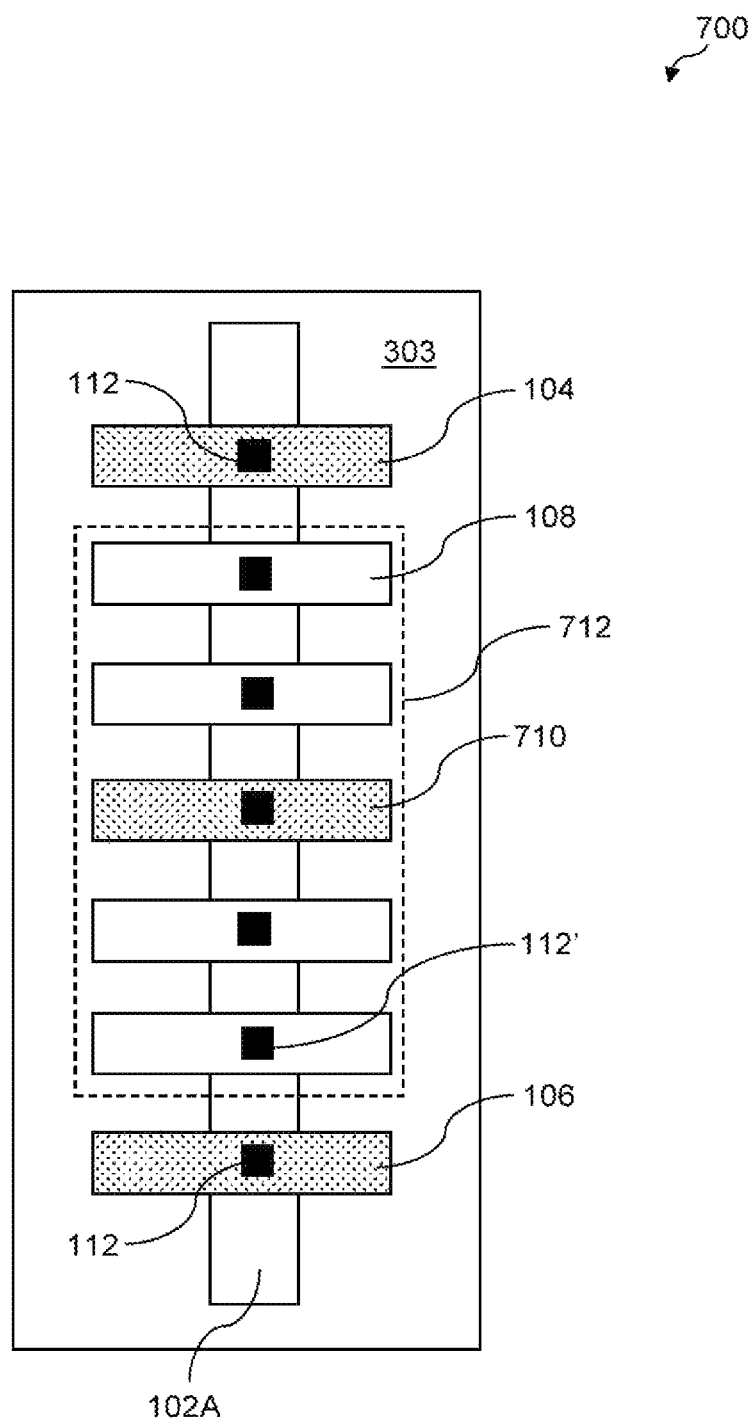
FIG. 7 is a top view of a resistor structure having an active conductive element that is interposed in a dummy conductive structure in accordance with an embodiment of the present invention.
Figure 8:
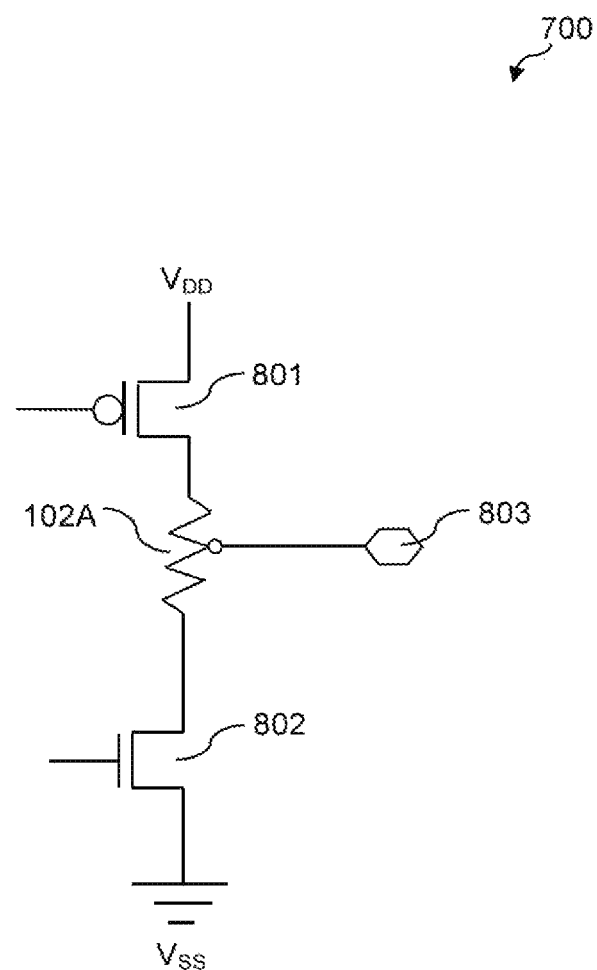
FIG. 8 is a schematic circuit diagram of a resistor structure with a center tap in accordance with an embodiment of the present invention.

FIG. 7 is a top view of resistor structure 700 having active conductor 710 interposed within dummy conductive structure 712 in accordance with an embodiment of the present invention. FIG. 8 is a circuit diagram of resistor structure 700 of FIG. 7 in accordance with an embodiment of the present invention. It should be appreciated that resistor structure 700 may share similar components (e.g., resistor body 102, conductive strips 104 and 106, dummy conductors 108, and conductive via structures 112 and 112') with resistor structure 101 of FIG. 1 to provide functionality similar to that described above, and therefore will not be described in detail.

As shown in FIGS. 7 and 8, resistor body 102 may include two distal terminals, with each terminal coupled to a conductive metal strip (e.g., conductive strips 104 and 106). Conductive strips 104 and 106 may represent the respective distal terminals of resistor body 102. In one embodiment, conductive strip 104 of resistor structure 700 may be coupled to PMOS transistor 801, whereas conductive strip 106 may be coupled to NMOS transistor 802.

For example, as shown in FIG. 8, the first terminal of resistor body 102 may be coupled to a drain terminal of PMOS transistor 801, whereas the second distal terminal of resistor body 102 is coupled to a drain terminal of NMOS transistor 802 via conductive strip 106. PMOS transistor 801 may have a source terminal that is coupled to a positive power supply voltage $V_{DD}$, whereas NMOS transistor 802 may have a source terminal that is coupled to a ground power supply voltage $V_{SS}$. Configured in this way, a center tap may be formed halfway along the element of resistor body 102 to form a contact.

In one embodiment, the center tap is formed using an actively driven conductive element (e.g., active conductor 710), which is interposed directly between first and second dummy conductors of dummy conductors 108 of dummy conductive structure 712 and connected to resistor body 102, as shown in FIG. 7. In one embodiment, active conductor 710 may serve to route signals (via contact node 803) for a circuit on an integrated circuit device (not shown), in which resistor body 102 is a resistive component within the circuit. For example, active conductor 710 may establish a half voltage point and resistance from the two distal terminals of resistor body 102 in power source VDD to the circuit on the integrated circuit.

Figure 9:
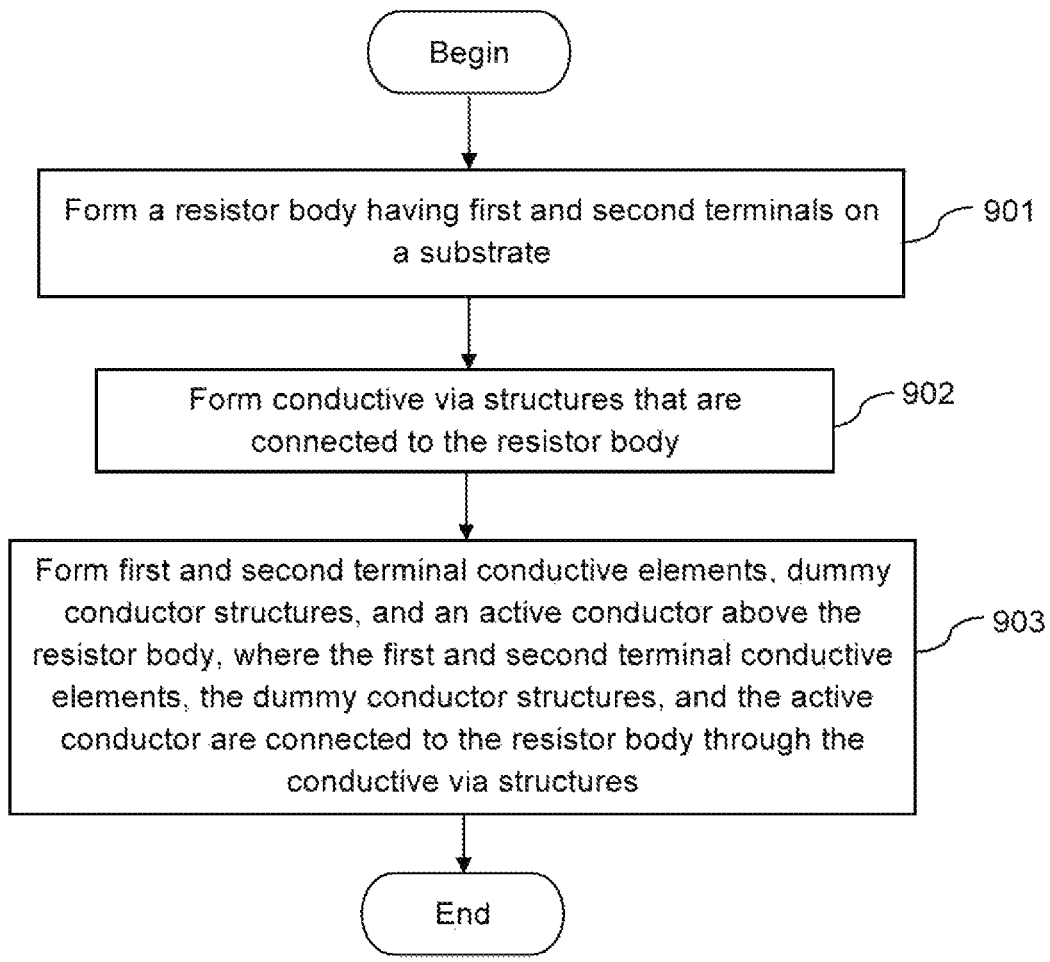
FIG. 9 shows a flowchart of illustrative steps for fabricating a resistor body on a substrate in accordance with an embodiment of the present invention.

FIG. 9 shows a flowchart of illustrative steps for fabricating a resistor body on a substrate in accordance with one embodiment of the present invention. It should be appreciated that the embodiments of FIGS. 1, 3, 4, 5, 6, and 7 may be used as examples to illustrate the steps described below.

At step 901, a resistor body having first and second terminals is formed on a substrate. As shown in FIGS. 1 and 2, continuous resistor body 102 having two distal terminals are formed over a surface of semiconductor substrate 203 via insulating layer 202 (or oxide layer 202). At step 902, conductive via structures that are connected to the resistor body are formed. As shown in FIG. 2, conductive via structures 112 are formed to connect resistor body 102 to metal layer M1, which is formed on insulation layer 204. In other embodiments, two or more resistors may also be formed on the substrate depending on design requirements. For example, as shown in FIGS. 3, 4, 5, and 6, two resistor bodies 102 and 302 that are connected in series may be formed on semiconductor substrate 303.

At step 903, first and second terminal conductive elements, dummy conductor structures, and an active conductor are formed above the resistor body, where the first and second terminal conductive elements, the dummy conductor structures, and the active conductor are connected to the resistor body through the conductive via structures. The first terminal conductive element is connected to the first terminal of the resistor body, and the second terminal conductive element is connected to the second terminal of the resistor body.

For example, as shown in FIG. 1, the first terminal conductive element (e.g., conductive strip 104) is connected to a first terminal of resistor body 102 through conductive via structures 112. Similarly, the second terminal conductive element (e.g., conductive strip 106) is connected to a second terminal of resistor body 102 through conductive via structures 112. In FIG. 1, conductive strips 104 and 106 may represent the respective terminals of resistor body 102. In one embodiment, conductive strip 104 may be connected to a power source, and the conductive strip 106 may be connected to a ground source.

The dummy conductor structures are formed between the first and second terminal conductive elements. The first and second terminal conductive elements and the dummy conductor structures are connected to the respective conductive via structures. For example, the dummy conductor structure may include one or more dummy conductor elements which can be in the form of strips (e.g., dummy conductors 108 of FIG. 3 and dummy conductors 408 of FIG. 4), a plate (e.g., dummy conductive plate 508 of FIG. 5), or an array of plate segments (e.g., an array of dummy conductor elements 605 of FIG. 6). During operation, the resistance of the resistor body tends to increase with increasing temperature. The heat generated at the center of the resistor body has a lower degree of heat dissipation than the edges of resistor body 102 due to less surface area, where conductive strips 104 and 106 are connected through conductive via structures 112'. Hence, the dummy conductor structures are used to dissipate thermal energy or heat produced by the resistor body.

In one embodiment, the center tap is formed using the active conductor (or actively driven conductive element), which is interposed in the dummy conductive structure. For example, as shown in FIG. 7, active conductor 710 may be interposed directly between first and second dummy conductors 108 of dummy conductive structure 712 and connected to resistor body 102, as shown in FIG. 7. In one embodiment, active conductor 710 may be used to form a center tap along the element, of resistor body 102 without requiring an additional resistor body to form a contact to a circuit on an integrated circuit (not shown). For example, active conductor 710 may serve to route signals (via contact node 803 of FIG. 8) for the circuit, in which resistor body 102 is a resistive component within the circuit.

The method and apparatus described herein may be incorporated into any suitable circuit. For example, the method and apparatus may be incorporated into numerous types of devices such as microprocessors or other integrated circuits. Exemplary integrated circuits include programmable array logic (PAL), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), just to name a few.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

The foregoing is merely illustrative of the principles of this invention and various modifications can be made by those skilled in the art without departing from the scope and spirit of the invention. The foregoing embodiments may be implemented individually or in any combination.

What is claimed is:

1. An integrated circuit comprising:
   a continuous resistor body having first and second distal terminals; and
   a plurality of dummy conductors that are formed above the continuous resistor body and between the first and second distal terminals of the continuous resistor body, wherein each of the plurality of dummy conductors is physically attached to the continuous resistor body through a respective via structure.

2. The integrated circuit defined in claim 1, wherein the first distal terminal of the continuous resistor body is coupled to a power source.

3. The integrated circuit defined in claim 1, wherein the second distal terminal of the continuous resistor body is coupled to a ground source.

4. The integrated circuit defined in claim 1, wherein the plurality of dummy conductors is not actively driven.

5. The integrated circuit defined in claim 1, wherein each dummy conductor in the plurality of dummy conductors is parallel to one another.

6. The integrated circuit defined in claim 1, wherein the plurality of dummy conductors runs perpendicular to the continuous resistor body.

7. An integrated circuit comprising:
   a substrate;
   a resistor body formed on the substrate;

a dummy conductor above the resistor body, wherein the dummy conductor is coupled to the resistor body and dissipates heat for the resistor body; and a via having a first end that is attached to the resistor body and a second end that is attached to the dummy conductor.

8. The integrated circuit defined in claim 7, wherein the dummy conductor comprises one of a plurality of dummy conductors that are not actively driven.

9. The integrated circuit defined in claim 8, wherein the plurality of dummy conductors are parallel to one another.

10. The integrated circuit defined in claim 7, wherein the resistor body is formed from material selected from the group consisting of: polysilicon, nitride, titanium, and platinum.

11. The integrated circuit defined in claim 7, wherein the resistor body has a width, and wherein each of the plurality of dummy conductors has a length that is equal to the width of the resistor body.

12. The integrated circuit defined in claim 7, wherein the resistor body has a width, and wherein each of the plurality of dummy conductors has a length that exceeds the width of the resistor body.

* * * * *